United States Patent
Yin et al.

(10) Patent No.: US 9,147,762 B2
(45) Date of Patent: Sep. 29, 2015

(54) SEMICONDUCTOR DEVICE AND METHOD FOR MANUFACTURING THE SAME

(75) Inventors: Haizhou Yin, Poughkeepsie, NY (US); Wei Jiang, Beijing (CN); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/354,648

(22) PCT Filed: Jul. 31, 2012

(86) PCT No.: PCT/CN2012/079401
§ 371 (c)(1),
(2), (4) Date: Apr. 28, 2014

(87) PCT Pub. No.: WO2014/012275
PCT Pub. Date: Jan. 23, 2014

(65) Prior Publication Data
US 2014/0299919 A1    Oct. 9, 2014

(30) Foreign Application Priority Data
Jul. 19, 2012    (CN) .......................... 2012 1 0250438

(51) Int. Cl.
*H01L 27/01*        (2006.01)
*H01L 29/78*        (2006.01)
(Continued)

(52) U.S. Cl.
CPC ............ *H01L 29/78* (2013.01); *H01L 29/1054* (2013.01); *H01L 29/165* (2013.01); *H01L 29/6659* (2013.01); *H01L 29/66477* (2013.01); *H01L 29/66636* (2013.01); *H01L 29/7833* (2013.01); *H01L 29/7848* (2013.01); *H01L 29/66545* (2013.01)

(58) Field of Classification Search
CPC ......... H01L 29/08; H01L 29/66; H01L 29/78; H01L 29/165; H01L 29/1054; H01L 29/6659; H01L 29/7833; H01L 29/66545; H01L 29/66636; H01L 29/66477; H01L 21/336; H01L 29/7848; H01S 21/36
USPC ........................................................ 257/192
See application file for complete search history.

(56) References Cited

U.S. PATENT DOCUMENTS 6,657,223 B1 * 12/2003 Wang et al. .................... 257/19
6,881,635 B1    4/2005 Chidambarrao et al.
(Continued)

FOREIGN PATENT DOCUMENTS

CN    101027763 A    8/2007

OTHER PUBLICATIONS

International Search Report and Written Opinion for PCT Application No. PCT/CN2012/079401, dated Mar. 21, 2013, 8 pages (English translation of Search Report only).

*Primary Examiner* — Armando Rodriguez
(74) *Attorney, Agent, or Firm* — Westman, Champlin & Koehler, P.A.

(57) ABSTRACT

A semiconductor device and a method for manufacturing the same are provided. In one embodiment, the method comprises: growing a first epitaxial layer on a substrate; forming a sacrificial gate stack on the first epitaxial layer; selectively etching the first epitaxial layer; growing and in-situ doping a second epitaxial layer on the substrate; forming a spacer on opposite sides of the sacrificial gate stack; and forming source/drain regions with the spacer as a mask.

9 Claims, 7 Drawing Sheets (51) Int. Cl.
  *H01L 29/10* (2006.01)
  *H01L 29/165* (2006.01)
  *H01L 29/66* (2006.01)

(56) References Cited

U.S. PATENT DOCUMENTS 7,332,439 B2    2/2008   Lindert et al.
2004/0188760 A1*  9/2004  Skotnicki et al. ............. 257/347
2005/0242340 A1* 11/2005  Chidambarrao et al. ........ 257/19
2006/0197164 A1*  9/2006  Lindert et al. ................. 257/409
2006/0228842 A1  10/2006  Zhang et al.
2007/0001164 A1*  1/2007  Cha ................................ 257/19
2008/0142840 A1*  6/2008  Lindert et al. ................. 257/190
2013/0146952 A1*  6/2013  Adam et al. ................... 257/296

* cited by examiner

SEMICONDUCTOR DEVICE AND METHOD FOR MANUFACTURING THE SAME

CROSS-REFERENCE TO RELATED APPLICATION

This application is a Section 371 National Stage Application of International Application No. PCT/CN2012/079401, filed Jul. 31, 2012 and published as WO 2014/012275 A1 on Jan. 23, 2014, which claims priority to Chinese Application No. 201210250438.6, entitled "SEMICONDUCTOR DEVICE AND METHOD FOR MANUFACTURING THE SAME," filed on Jul. 19, 2012, which is incorporated herein by reference in their entirety.

TECHNICAL FIELD

The present disclosure relates to the semiconductor field, and particularly, to a semiconductor device and a method for manufacturing the same.

BACKGROUND

With continuous scaling down of semiconductor devices, short channel effects are becoming more significant. On solution to suppress the short channel effects is to reduce the junction depth of source/drain extension regions. To form such shallow extension regions, it is necessary to adopt low-energy ion implantation in extension implantation, followed by ultra-short annealing to activate implanted ions. This poses challenges on manufacture apparatus and manufacture processes.

On the other hand, the ion implantation may cause substrate damages. Thus, an additional annealing process is needed to remove the damages.

SUMMARY

The present disclosure provides, among others, a semiconductor device and a method for manufacturing the same.

According to an aspect of the present disclosure, there is provided a method for manufacturing a semiconductor device, comprising: growing a first epitaxial layer on a substrate; forming a sacrificial gate stack on the first epitaxial layer; selectively etching the first epitaxial layer; growing and in-situ doping a second epitaxial layer on the substrate; forming a spacer on opposite sides of the sacrificial gate stack; and forming source/drain regions with the spacer as a mask.

According to a further aspect of the present disclosure, there is provided a semiconductor device, comprising: a gate stack formed on a substrate; a first epitaxial layer, which is in-situ doped and grown on the substrate, and is configured as source/drain extension regions; and source/drain regions.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, and relative sizes and positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

Next, an embodiment of the present disclosure will be described in detail with reference to FIGS. 1-6.

Figure 1:
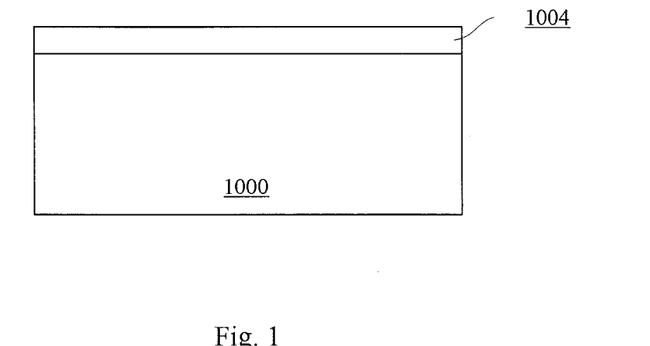
FIGS. 1-6 are schematic views showing a flow of manufacturing a semiconductor device according to an embodiment of the present disclosure.

As shown in FIG. 1, a substrate 1000 is provided. The substrate 1000 may comprise any suitable substrate, including, but not limited to, a bulk semiconductor substrate such as a bulk Si substrate, a Semiconductor on Insulator (SOI) substrate, a SiGe substrate, and the like. For convenience, the following descriptions are given with respect to the bulk Si substrate by way of example.

On the substrate 1000, an epitaxial layer 1004 may be grown by means of, for example, epitaxy. For example, the epitaxial layer 1004 may comprise SiGe (where an atomic percentage of Ge can be about 10%), with a thickness of about 5-10 nm. The thickness of the epitaxial layer 1004 substantially determines a thickness of source/drain extension regions to be formed later.

Figure 2:
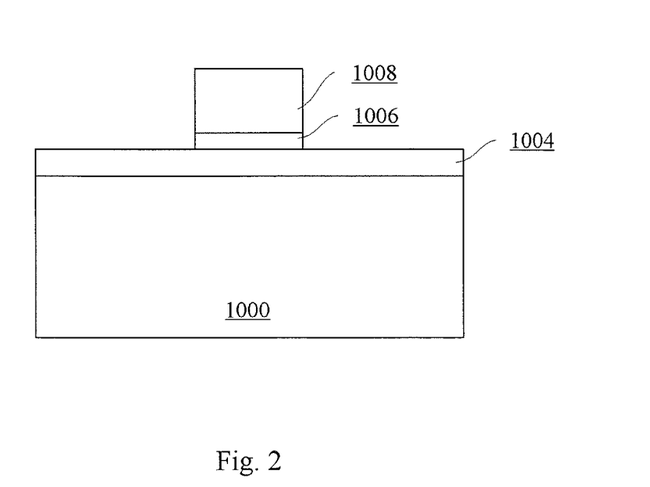

Subsequently, as shown in FIG. 2, on the epitaxial layer 1004, a sacrificial gate stack may be formed. For example, the sacrificial gate stack can be formed by sequentially depositing an oxide layer 1006 and a nitride layer 1008 and then patterning them. It is to be noted that there are various ways to form the sacrificial gate stack. The sacrificial gate stack comprising the oxide layer 1006 and the nitride layer 1008, as shown in FIG. 2, is just an example. According to embodiments of the present disclosure, the sacrificial gate stack preferably comprises a dielectric material such as oxide, nitride or a combination thereof, instead of a crystal semiconductor material (e.g., polysilicon), for convenience of following processes. It is intended to prevent following selective epitaxy from occurring at the sacrificial gate stack.

Figure 3:
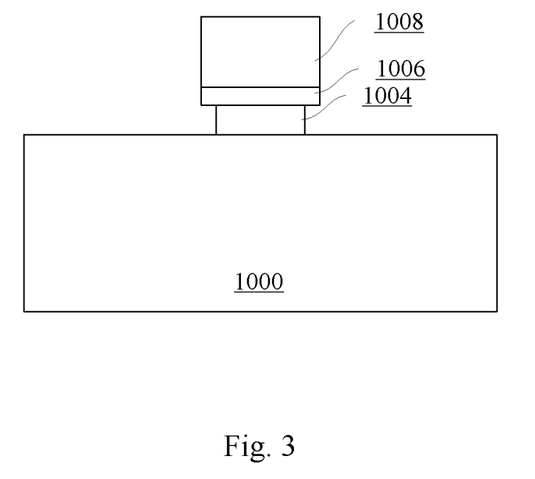

Next, as shown in FIG. 3, the epitaxial layer 1004 may be subjected to selective etching. Such selective etching may be accomplished by wet etching, dry etching, or a combination thereof. Due to the etching selectively between the epitaxial layer 1004 (e.g., SiGe) and the substrate (e.g., Si), the etching can be stopped on the substrate 1000. A portion of the epitaxial layer 1004 underlying the sacrificial gate stack can be reserved due to the presence of the sacrificial gate stack. In the example shown in FIG. 3, lateral edges of the etched epitaxial layer 1004 are illustrated as being slightly recessed with respect to respective lateral edges of the sacrificial gate stack by an extent which can be controlled by conditions in the etching process.

Figure 4:
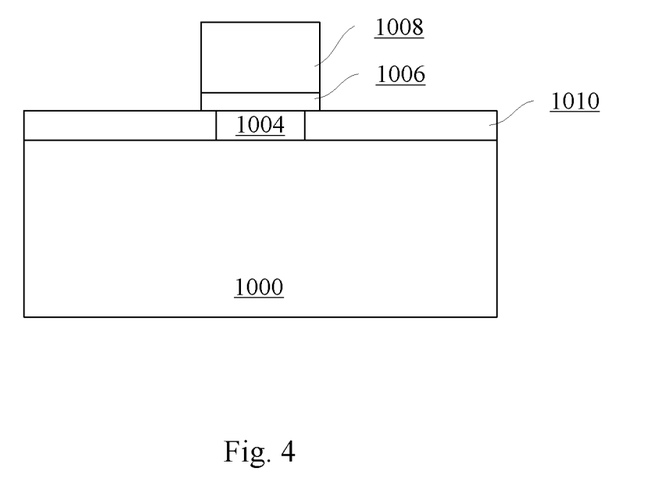

Then, as shown in FIG. 4, an epitaxial layer 1010 may be grown on portions of the substrate 1000 exposed by the above selective etching by means of, for example, epitaxy. The epitaxial layer 1010 may comprise Si. Because the sacrificial gate stack comprises dielectric materials such as oxide and nitride, the epitaxy will not occur at surfaces of the sacrificial gate stack. The epitaxial layer 1010 can be doped in-situ into an appropriate conductivity type while being grown. For example, for an n-type device, the epitaxial layer 1010 may be doped with n-type impurities, such as As or P, into the n-type; while for a p-type device, the epitaxial layer 1010 may be doped with p-type impurities, such as In, $BF_2$, or B, into the p-type. The in-situ doped epitaxial layer 1010 can serve as extension regions of the device to be formed.

Figure 5:
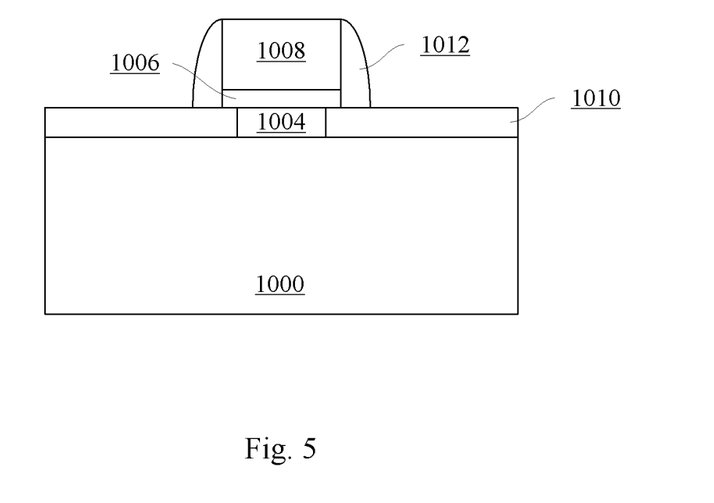

Next, as shown in FIG. 5, a spacer 1012 may be formed on opposite sides of the sacrificial gate stack. For example, the spacer 1012 may comprise silicon nitride, silicon oxide, or a combination thereof. There are various ways to form the spacer, and thus detailed descriptions thereof are omitted here.

Figure 6:
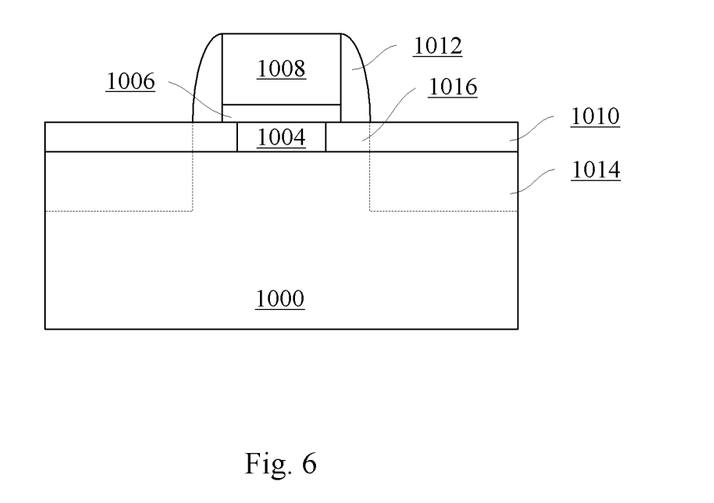

Subsequently, as shown in FIG. 6, source/drain regions 1014 may be formed with the spacer as a mask. For example; the source/drain regions 1014 may be formed by means of ion implantation. Specifically, for an n-type device, n-type impurities such as As or P may be implanted; while for a p-type device, p-type impurities may be implanted. Following the ion implantation, annealing can be carried out to activate implanted ions.

After that, a gate replacement process can be performed. Specifically, the sacrificial gate stack (comprising the nitride layer 1008 and the oxide layer 1006 in this example) can be removed by selective etching, resulting in a groove inside the spacer. Then, a gate dielectric layer and a gate conductor can be filled into the groove, to form a true gate stack. For example, the gate dielectric layer may comprise a high-K gate dielectric, and the gate conductor may comprise a metal gate conductor.

Thus, a semiconductor device according to an embodiment of the present disclosure is achieved. As shown in FIG. 6, the semiconductor device comprises the in-situ doped epitaxial layer 1010 formed on the substrate. The epitaxial layer 1010 (especially, portions thereof close to a channel region) servers as the source/drain extension regions 1016 of the semiconductor device. The epitaxial layer 1010 has its thickness substantially determined by the thickness of the epitaxial layer 1004, due to its formation process. In other words, the thickness of the epitaxial layer 1004 substantially determines the depth of the extension regions 1016. Because the thickness of the epitaxial layer 1004 grown on the substrate can be controlled in a relatively accurate manner to be relatively thin, it is possible to from the extension regions 1016 which are relatively shallow. Further, the extension regions 1016 can be in-situ doped while being grown. As a result, it is possible to avoid ion implantation and thus avoid ultra-short annealing thereon.

Hereinafter, a further embodiment of the present disclosure will be described in detail with reference to FIGS. 7-14.

Figure 7:
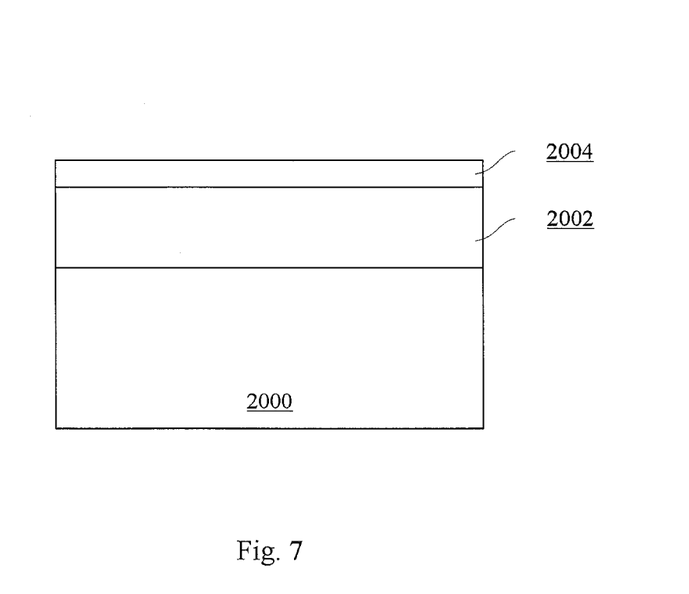
FIGS. 7-14 are schematic views showing a flow of manufacturing a semiconductor device according to a further embodiment of the present disclosure.

As shown in FIG. 7, a substrate 2000 is provided. The substrate 2000 may comprise any suitable substrate, including, but not limited to, a bulk semiconductor substrate such as a bulk Si substrate, a Semiconductor on Insulator (SOI) substrate, a SiGe substrate, and the like. For convenience, the following descriptions are given with respect to the bulk Si substrate by way of example.

On the substrate 2000, an epitaxial layer 2002 may be grown by means of, for example, epitaxy. For example, the epitaxial layer 2002 may comprise SiGe (where an atomic percentage of Ge can be about 10%), with a thickness of about 30-50 nm. The thickness of the epitaxial layer 2002 substantially determines a thickness of source/drain regions to be formed later.

Further, on the epitaxial layer 2002, a further epitaxial layer 2004 may be grown by means of, for example, epitaxy. For example, the epitaxial layer 2004 may comprise Si, with a thickness of about 5-10 nm. The thickness of the epitaxial layer 2004 substantially determines a thickness of source/drain extension regions to be formed later.

Figure 8:
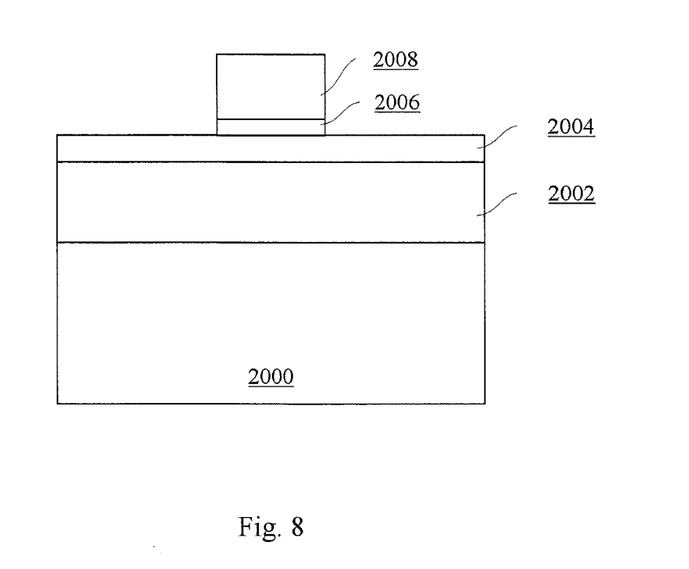

Subsequently, as shown in FIG. 8, on the epitaxial layer 2004, a sacrificial gate stack may be formed. For example, the sacrificial gate stack can be formed by sequentially depositing an oxide layer 2006 and a nitride layer 2008 and then patterning them. As for the sacrificial gate stack, reference may be made to the above descriptions in conjunction with FIG. 2.

Figure 9:
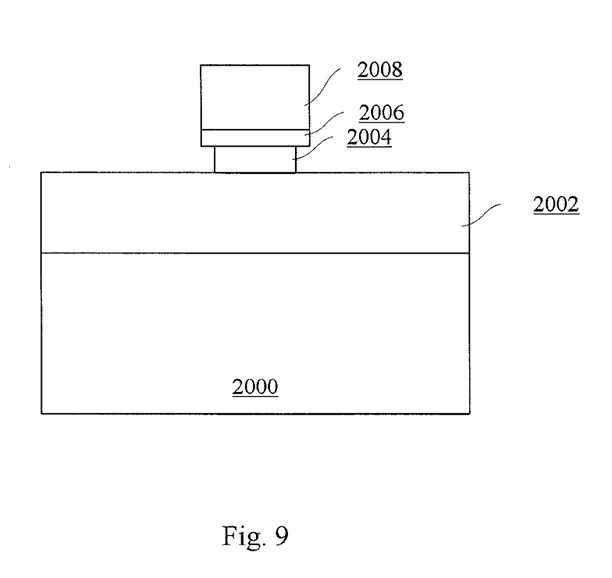

Next, as shown in FIG. 9, the epitaxial layer 2004 may be subjected to selective etching. Such selective etching may be accomplished by wet etching, dry etching, or a combination thereof. Due to the etching selectively between the epitaxial layer 2004 (e.g., Si) and the epitaxial layer 2002 (e.g., SiGe), the etching can be stopped on the epitaxial layer 2002. A portion of the epitaxial layer 2004 underlying the sacrificial gate stack can be reserved due to the presence of the sacrificial gate stack. In the example shown in FIG. 9, lateral edges of the etched epitaxial layer 2004 are illustrated as being slightly recessed with respect to respective lateral edges of the sacrificial gate stack by an extent which can be controlled by conditions in the etching process.

Figure 10:
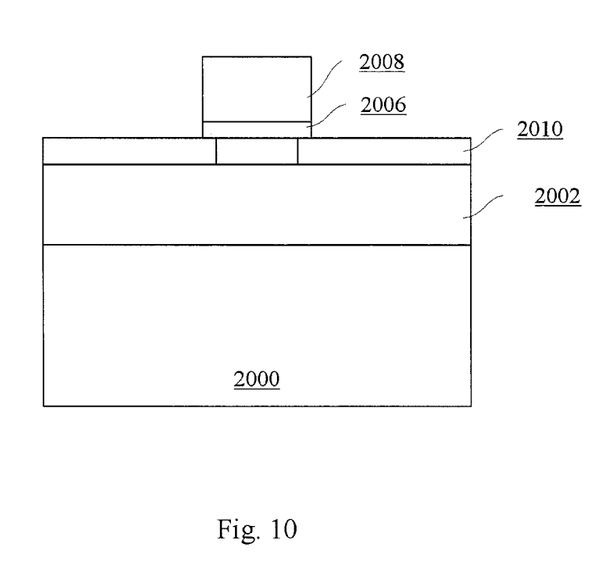

Then, as shown in FIG. 10, an epitaxial layer 2010 may be grown on portions of the epitaxial layer 2002 exposed by the above selective etching by means of, for example, epitaxy. The epitaxial layer 2010 may comprise Si. Because the sacrificial gate stack comprises dielectric materials such as oxide and nitride, the epitaxy will not occur at surfaces of the sacrificial gate stack. The epitaxial layer 2010 can be doped in-situ into an appropriate conductivity type while being grown. For example, for an n-type device, the epitaxial layer 2010 may be doped with n-type impurities, such as As or P, into the n-type; while for a p-type device, the epitaxial layer 2010 may be doped with p-type impurities, such as In, $BF_2$, or B, into the p-type. The in-situ doped epitaxial layer 2010 can serve as extension regions of the device to be formed.

Figure 11:
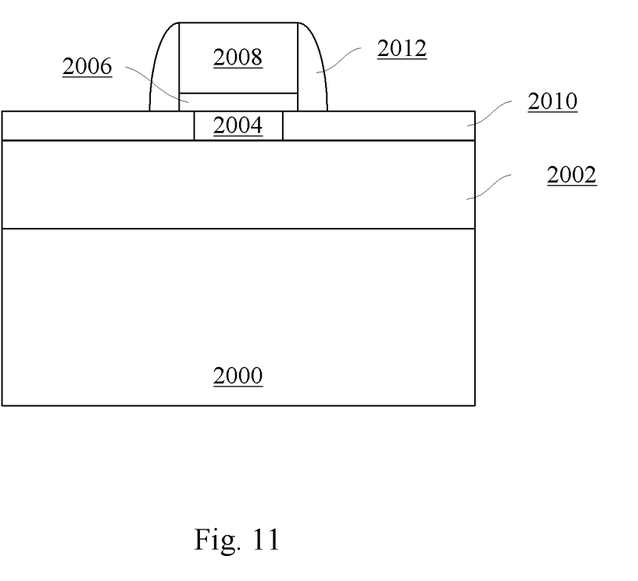

Next, as shown in FIG. 11, a spacer 2012 may be formed on opposite sides of the sacrificial gate stack. For example, the spacer 2012 may comprise silicon nitride, silicon oxide, or a combination thereof. There are various ways to form the spacer, and thus detailed descriptions thereof are omitted here.

Figure 12:
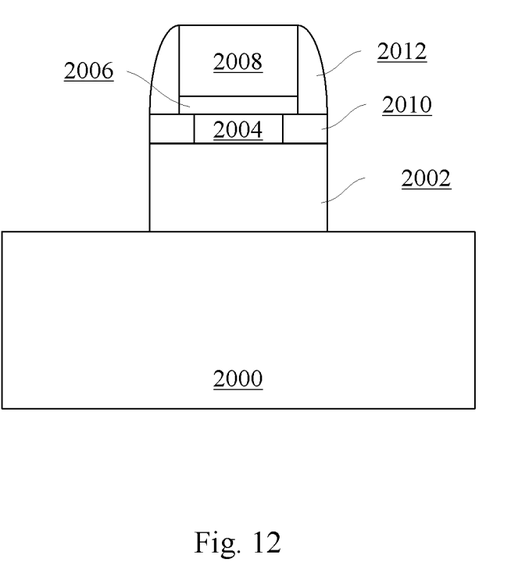

Subsequently, as shown in FIG. 12, the epitaxial layer 2020 and the epitaxial layer 2002 may be subjected to selective etching with the spacer as a mask. Such selective etching may be accomplished by wet etching, dry etching, or a combination thereof. Due to the presence of the sacrificial gate stack and the spacer, portions of the epitaxial layer 2020 and the epitaxial layer 2002 underlying them are reserved.

Figure 13:
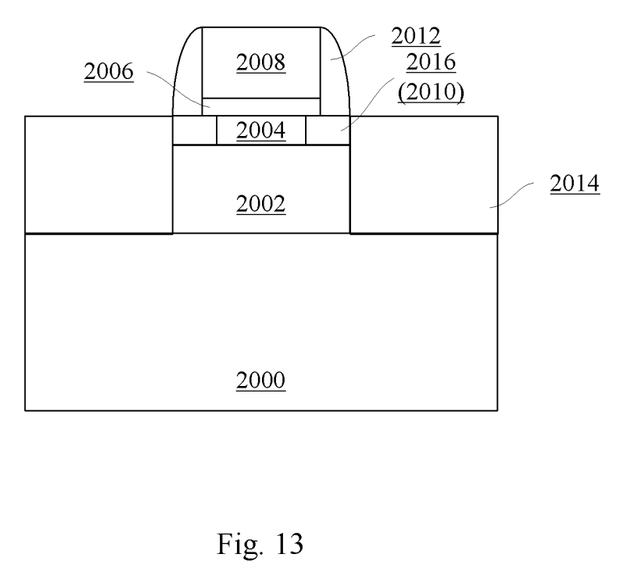

Then, as shown in FIG. 13, an epitaxial layer 2014 may be grown on portions of the substrate 2000 exposed by the above selective etching by means of, for example, epitaxy. The epitaxial layer 2014 may comprise Si. Because the sacrificial gate stack comprises dielectric materials such as oxide and nitride, the epitaxy will not occur at surfaces of the sacrificial gate stack. The epitaxial layer 2014 can be doped in-situ into an appropriate conductivity type while being grown. For example, for an n-type device, the epitaxial layer 2014 may be doped with n-type impurities, such as As or P, into the n-type; while for a p-type device, the epitaxial layer 2014 may be doped with p-type impurities, such as In, $BF_2$, or B, into the p-type. The in-situ doped epitaxial layer 2014 can serve as source/drain regions of the device to be formed. Further, the remaining portions of the in situ doped epitaxial layer 2010 can serve as the source/drain extensions 2016 of the device.

According to an example of the present disclosure, to improve performances of the device, the epitaxial layer 2014 may comprise SiGe (for a p-type device, where an atomic percentage of Ge can be greater than about 30%) or Si:C (for an n-type device). The epitaxial layer 2014 in such a configuration can apply stress to a channel region of the device, so as to enhance the mobility of carriers and thus improve the performances of the device.

After that, a gate replacement process can be performed. Specifically, the sacrificial gate stack (comprising the nitride layer 2008 and the oxide layer 2006 in this example) can be removed by selective etching, resulting in a groove inside the spacer. Then, a gate dielectric layer 2018 and a gate conductor 2020 can be filled into the groove, to form a true gate stack. For example, the gate dielectric layer 2018 may comprise a high-K gate dielectric, and the gate conductor 2020 may comprise a metal gate conductor. There may be further a work-function adjustment layer (not shown) interposed between the gate dielectric layer 2018 and the gate conductor 2020. Then, an inter-layer dielectric layer 2022 (e.g., oxide) may be formed by means of, for example, deposition, and then subjected to CMP, resulting in the semiconductor device shown in FIG. 14.

Figure 14:
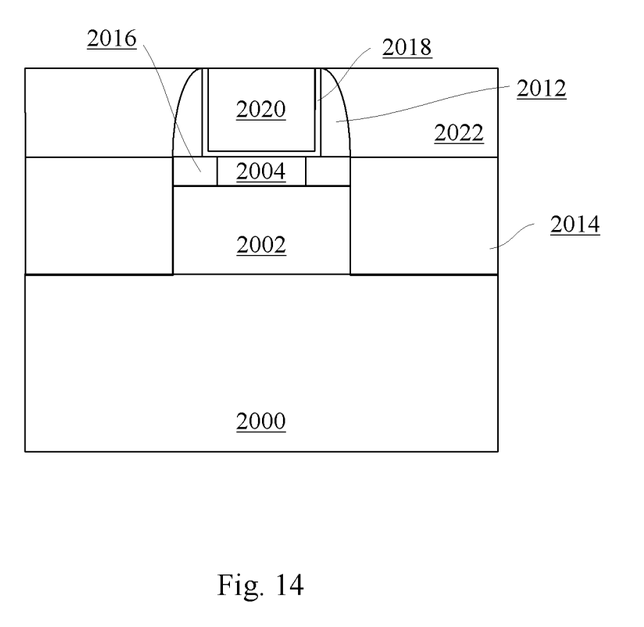

As shown in FIG. 14, the semiconductor device comprises a gate stack (including the gate dielectric layer 2018 and the gate conductor 2020) formed on the substrate. The in-situ doped epitaxial layer 2010 serves as the source/drain extension regions 2016 of the semiconductor device. Like the above described embodiment, the extension regions 2016 formed in such a way can be controlled to be relatively shallow, and also it is possible to avoid ion implantation.

Further, the semiconductor device comprises the source/drain regions formed of the epitaxial layer 2014. Likewise, the source/drain regions can be in-situ doped while being grown. As a result, it is possible to avoid ion implantation and thus avoid ultra-short annealing thereon.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method for manufacturing a semiconductor device, comprising:
    growing a first epitaxial layer on a substrate;
    growing a second epitaxial layer on the first epitaxial layer;
    forming a sacrificial gate stack on the second epitaxial layer;
    selectively etching the second epitaxial layer with the sacrificial gate stack as a mask;
    growing and in-situ doping a third epitaxial layer on the first epitaxial layer;
    forming a spacer on opposite sides of the sacrificial gate stack;
    selectively etching the third epitaxial layer and the first epitaxial layer with the spacer as a mask; and
    growing and in-situ doping a fourth epitaxial layer on the substrate to form source/drain regions.

2. The method according to claim 1, wherein after formation of the source/drain regions, the method further comprises:
    removing the sacrificial gate stack to form a groove inside the spacer; and
    forming a gate dielectric layer and a gate conductor layer sequentially in the groove.

3. The method according to claim 1, wherein the substrate comprises Si, the first epitaxial layer comprises SiGe, the second epitaxial layer comprises Si, the third epitaxial layer comprises SiGe, and the fourth epitaxial layer comprises Si, SiGe, or Si:C.

4. The method according to claim 1, wherein the sacrificial gate stack comprises a dielectric material.

5. A semiconductor device, comprising:
    a substrate;
    a first epitaxial layer grown on the substrate;
    a second epitaxial layer grown on the first epitaxial layer, with lateral ends recessed with respect to respective lateral ends of the first epitaxial layer;
    a third epitaxial layer grown on the first epitaxial layer and abutting the second epitaxial layer, wherein the third epitaxial layer is in-situ doped and thus configured as source/drain extension regions;
    a gate stack formed on the second epitaxial layer; and
    a fourth epitaxial layer grown on the substrate and abutting the first and third epitaxial layers, wherein the fourth epitaxial layer is in-situ doped and thus conflured as source/drain regions.

6. The semiconductor device according to claim 5, wherein the second epitaxial layer has a thickness substantially the same as that of the third epitaxial layer.

7. The semiconductor device according to claim 5, wherein the lateral ends of the second epitaxial layer are recessed with respect to respective lateral edges of the gate stack, and thus the third epitaxial layer extends under the gate stack.

8. The semiconductor device according to claim 5, wherein the third epitaxial layer has its lateral ends away from the second epitaxial layer, substantially flush with respective lateral ends of the first epitaxial layer.

9. The semiconductor device according to claim 8, further comprising a spacer formed on opposite sides of the gate stack, wherein the lateral ends of the first and third epitaxial layers are defined by the spacer.

* * * * *